US007589375B2

(12) United States Patent
Jang et al.

(10) Patent No.: US 7,589,375 B2

(45) Date of Patent: Sep. 15, 2009

(54) NON-VOLATILE MEMORY DEVICES INCLUDING ETCHING PROTECTION LAYERS AND METHODS OF FORMING THE SAME

(75) Inventors: Jae-Hoon Jang, Gyeonggi-do (KR); Soon-Moon Jung, Seongnam-si (KR); Jong-Hyuk Kim, Gyeonggi-do (KR); Young-Seop Rah, Gyeonggi-do (KR); Han-Byung Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 177 days.

(21) Appl. No.: 11/642,297

(22) Filed: Dec. 20, 2006

(65) Prior Publication Data

US 2007/0096197 A1 May 3, 2007

Related U.S. Application Data

(63) Continuation-in-part of application No. 11/385,473, filed on Mar. 21, 2006.

(30) Foreign Application Priority Data

Mar. 22, 2005 (KR) ...................... 10-2005-0023801

(51) Int. Cl.
*H01L 27/115* (2006.01)

(52) U.S. Cl. .............................. 257/316; 257/E21.614; 257/E21.026; 438/257; 438/588

(58) Field of Classification Search .................. 257/74, 257/315–316, E21.614, E25.018, E27.026; 438/201, 211, 257, 455, 588
See application file for complete search history.

(56) References Cited

U.S. PATENT DOCUMENTS 5,266,511 A 11/1993 Takao
5,897,189 A 4/1999 Sako et al.
6,287,913 B1 9/2001 Agnello et al.
6,600,173 B2 7/2003 Tiwari
6,696,351 B1 2/2004 Kuroda
6,753,226 B2 6/2004 Tsugane et al.

(Continued)

FOREIGN PATENT DOCUMENTS

KR 10-1994-0008084 4/1994

(Continued)

*Primary Examiner*—M. Wilczewski
*Assistant Examiner*—Toniae M Thomas
(74) *Attorney, Agent, or Firm*—Myers Bigel Sibley & Sajovec

(57) ABSTRACT

A non-volatile memory device includes a semiconductor substrate including a cell array region and a peripheral circuit region. A first cell unit is on the semiconductor substrate in the cell array region, and a cell insulating layer is on the first cell unit. A first active body layer is in the cell insulating layer and over the first cell unit, and a second cell unit is on the first active body layer. The device further includes a peripheral transistor on the semiconductor substrate in the peripheral circuit region. The peripheral transistor has a gate pattern and source/drain regions, and a metal silicide layer is on the gate pattern and/or on the source/drain regions of the peripheral transistor. A peripheral insulating layer is on the metal silicide layer and the peripheral transistor, and an etching protection layer is between the cell insulating layer and the peripheral insulating layer and between the metal silicide layer and the peripheral insulating layer.

21 Claims, 11 Drawing Sheets

U.S. PATENT DOCUMENTS 6,881,621 B2 * 4/2005 Choe et al. .................. 438/251
7,387,919 B2 6/2008 Kwak et al.
7,417,286 B2 8/2008 Kim et al.
2001/0028059 A1 10/2001 Emma et al.
2002/0119640 A1 8/2002 Gonzalez
2004/0144979 A1 7/2004 Bhattacharyya
2004/0173833 A1 9/2004 Tsugane et al.
2006/0028861 A1 * 2/2006 Han et al. ................... 365/154
2006/0108627 A1 * 5/2006 Choi et al. .................. 257/314
2007/0047371 A1 * 3/2007 Park et al. .............. 365/230.06
2008/0023747 A1 * 1/2008 Park et al. ................... 257/314
2008/0067517 A1 * 3/2008 Jang et al. ...................... 257/67
2008/0067573 A1 * 3/2008 Jang et al. ................... 257/315
2008/0128780 A1 * 6/2008 Nishihara et al. ........... 257/316
2008/0268595 A1 * 10/2008 Lee et al. .................... 438/258

FOREIGN PATENT DOCUMENTS

KR 10-2004-0048039 6/2002
KR 10-2003-0049778 6/2003
KR 10-2004-0009867 1/2004

* cited by examiner

330
PG
325
I'
30
13
B
A
115
205
12
290
190
100
265
80
255
70
155
165
SG12
SG22
SG32
CG1n
CG2n
CG3n
CG1(n-1)
CG2(n-1)
CG3(n-1)
50
245
145
CG12
CG22
CG32
CG11
CG21
CG31
SG11
SG21
SG31
275
175
90
I 5
40
55
30
55
PG
13
40
B
10
35
12
45
SG12
35
45
CG1n
15
35
CG1(n-1)
50
45
CG12
A
20
25
35
20
CG11
12
25
45
SG11
35

145
110
5
40
13
30
PG
B
55
10
113
60
140
SG22
130
12
70
115
83
140
SG12
CG2n
CG1n
120
15
135
35
CG2(n-1)
50
CG1(n-1)
140
A
CG22
CG12
125
130
20
135
25
35
125
20
CG21
CG11
140
12
130
25
103
90
45
140
SG21
SG11
110
60

200
195
170
150
110
5
40
55
30
PG
13
B
10
60
12
A
168
165
160
155
113
SG22
115
CG2n
120
135
CG2(n-1)
145
190
70
83
SG12
CG1n
15
35
CG1(n-1)
50
CG22
125
130
CG12
20
25
CG21
193
190
180
175
140
SG21
103
90
45
CG11
SG11
60

300
295
270
250
200
110
5
290
265
260
268
255
203
113
155
168
83
70
60
10
40
55
30
PG
13
B
12
SG32
SG22
SG12
205
115
CG3n
CG2n
CG1n
210
120
15
235
135
35
245
145
50
CG3(n-1)
CG2(n-1)
CG1(n-1)
A
CG32
CG22
CG12
215
125
20
230
130
25
CG31
CG21
CG11
293
290
280
275
240
193
175
140
103
90
45
SG31
SG21
SG11
60
305

300
200
110
305
60
5
40
55
30
PG
13
10
B
A
12
290
293
275
240
230
215
210
245
268
255
203
205
235
SG32
CG3n
CG3(n-1)
CG32
CG31
SG31
193
175
140
130
125
120
145
168
155
113
115
135
SG22
CG2n
CG2(n-1)
CG22
CG21
SG21
103
90
45
25
20
15
50
83
70
35
SG12
CG1n
CG1(n-1)
CG12
CG11
SG11

330
320
315
300
290
293
275
268
255
245
240
235
230
215
210
205
203
200
193
175
168
155
145
140
135
130
125
120
115
113
110
103
90
83
70
60
55
50
45
40
35
30
25
20
15
13
12
10
5
310
305
PG
A
B
SG11
SG12
SG21
SG22
SG31
SG32
CG11
CG12
CG1(n-1)
CG1n
CG21
CG22
CG2(n-1)
CG2n
CG31
CG32
CG3(n-1)
CG3n

NON-VOLATILE MEMORY DEVICES INCLUDING ETCHING PROTECTION LAYERS AND METHODS OF FORMING THE SAME

CROSS-REFERENCE TO RELATED APPLICATIONS

The present application is a continuation-in-part of U.S. patent application Ser. No. 11/385,473, filed Mar. 21, 2006, which claims priority to Korean Patent Application No. 10-2005-0023801, filed Mar. 22, 2005, in the Korean Intellectual Property Office. The disclosures of all of the above applications are hereby incorporated herein in their entirety by reference.

FIELD OF THE INVENTION

The present invention relates to semiconductor devices and methods of forming the same, and more particularly, to non-volatile memory devices and methods of forming the same.

BACKGROUND

Static random access memory (SRAM) devices have been fabricated having cell gate patterns sequentially stacked on an active region of a semiconductor substrate. Current in the device may be increased when the cell gate patterns are arranged in a three-dimensional manner on the semiconductor substrate, compared with a two-dimensional arrangement. In addition, sequentially stacking the cell gate patterns may provide increased device density for a given set of design rules.

However, there may be a structural limit in applying a silicide process to a peripheral circuit region of an SRAM device. This is because the cell gate patterns of an SRAM device may be disposed vertically in the cell array region, while peripheral gate patterns are disposed laterally in the peripheral circuit region. Thus, when a silicide process is performed on the peripheral gate patterns and the semiconductor substrate near the peripheral gate patterns, the silicide process may cause metal contamination in the cell gate patterns, which may degrade the electrical characteristics of the SRAM device.

U.S. Pat. No. 6,287,913 (the '913 patent) discloses a double polysilicon process for providing both logic and memory circuits/devices in a single chip. According to the '913 patent, a double polysilicon process includes forming a memory gate stack on a memory region. After the gate stack is formed, a logic gate stack is formed on a logic region. A silicide process is then performed on the logic region to form cobalt (Co) or titanium (Ti) silicides on a top surface of the logic gate stack and the semiconductor substrate near the logic gate stack.

SUMMARY

A non-volatile memory device according to some embodiments of the invention includes a semiconductor substrate including a cell array region and a peripheral circuit region. A first cell unit is on the semiconductor substrate in the cell array region, and a cell insulating layer is on the first cell unit. A first active body layer is in the cell insulating layer and over the first cell unit, and a second cell unit is on the first active body layer. The device further includes a peripheral transistor on the semiconductor substrate in the peripheral circuit region. The peripheral transistor has a gate pattern and source/drain regions, and a metal silicide layer is on the gate pattern and/or on the source/drain regions of the peripheral transistor. A peripheral insulating layer is on the metal silicide layer and the peripheral transistor, and an etching protection layer is between the cell insulating layer and the peripheral insulating layer and between the metal silicide layer and the peripheral insulating layer.

Each of the first and second cell units may include a NAND-type string including a plurality of serially connected cell transistors. In some embodiments, each of the first and second cell units may include a NOR-type memory cell.

The first active body layer may have the same conductivity type as the semiconductor substrate in the cell array region. The metal silicide layer may include cobalt silicide ($CoSi_2$) and/or nickel silicide ($NiSi_2$). The etching protection layer may include a nitride, such as silicon nitride.

The non-volatile memory device may further include a second active body layer in the cell insulating layer and arranged over the second cell unit, and a third cell unit on the second active body layer and covered by the cell insulating layer.

Methods of forming non-volatile memory devices according to some embodiments of the invention include providing a semiconductor substrate having a cell array region and a peripheral circuit region, forming a first cell unit on the semiconductor substrate in the cell array region and a peripheral transistor on the semiconductor substrate in the peripheral region, and forming a first insulating layer on the first cell unit and the peripheral transistor. A first active body layer is formed on the first insulating layer in the cell array region, a second cell unit is formed on the first active body layer, and a second insulating layer is formed on the second cell unit and the first insulating layer. The methods further include patterning the first and second insulating layers to expose the peripheral transistor, forming a metal silicide layer on a gate pattern and/or on source/drain regions of the peripheral transistor, and forming a peripheral insulating layer on the metal silicide layer and the peripheral transistor.

The methods may further include forming an etching stop layer on the first cell unit and on the peripheral transistor prior to forming the first insulating layer, and removing the etching stop layer in the peripheral circuit region after patterning the first and second insulating layers.

The methods may further include forming an etching protection layer on the metal silicide layer prior to forming the peripheral insulating layer.

The methods may further include forming a second active body layer on the second insulating layer in the cell array region before patterning the first and second insulating layers, forming a third cell unit on the second active body layer, and forming a third insulating layer on the third cell unit and the second insulating layer. A portion of the third insulating layer in the peripheral circuit region may be removed while the first and second insulating layers are patterned.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
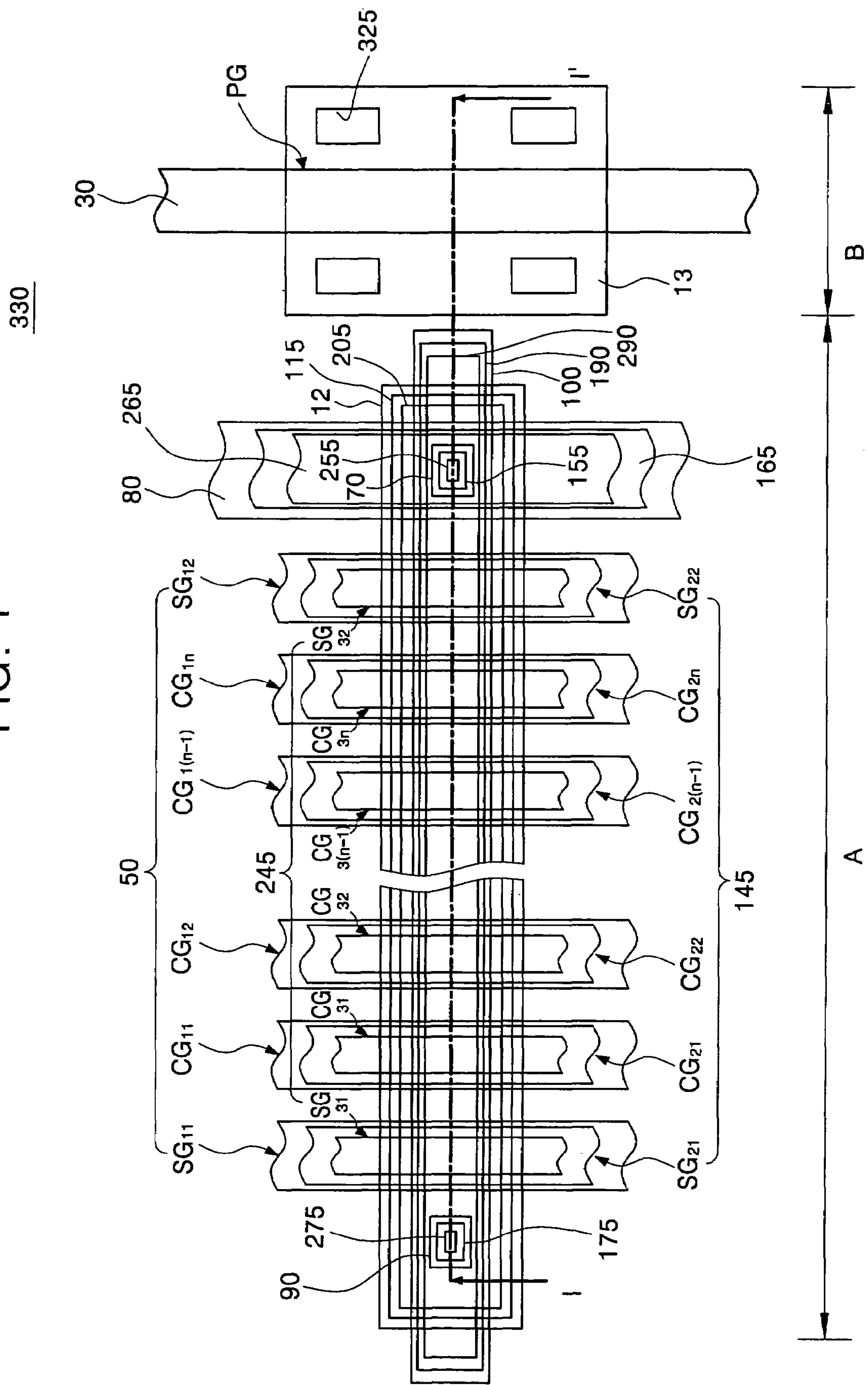
FIG. 1 is a layout diagram showing a non-volatile memory device according to some embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Figure 2:
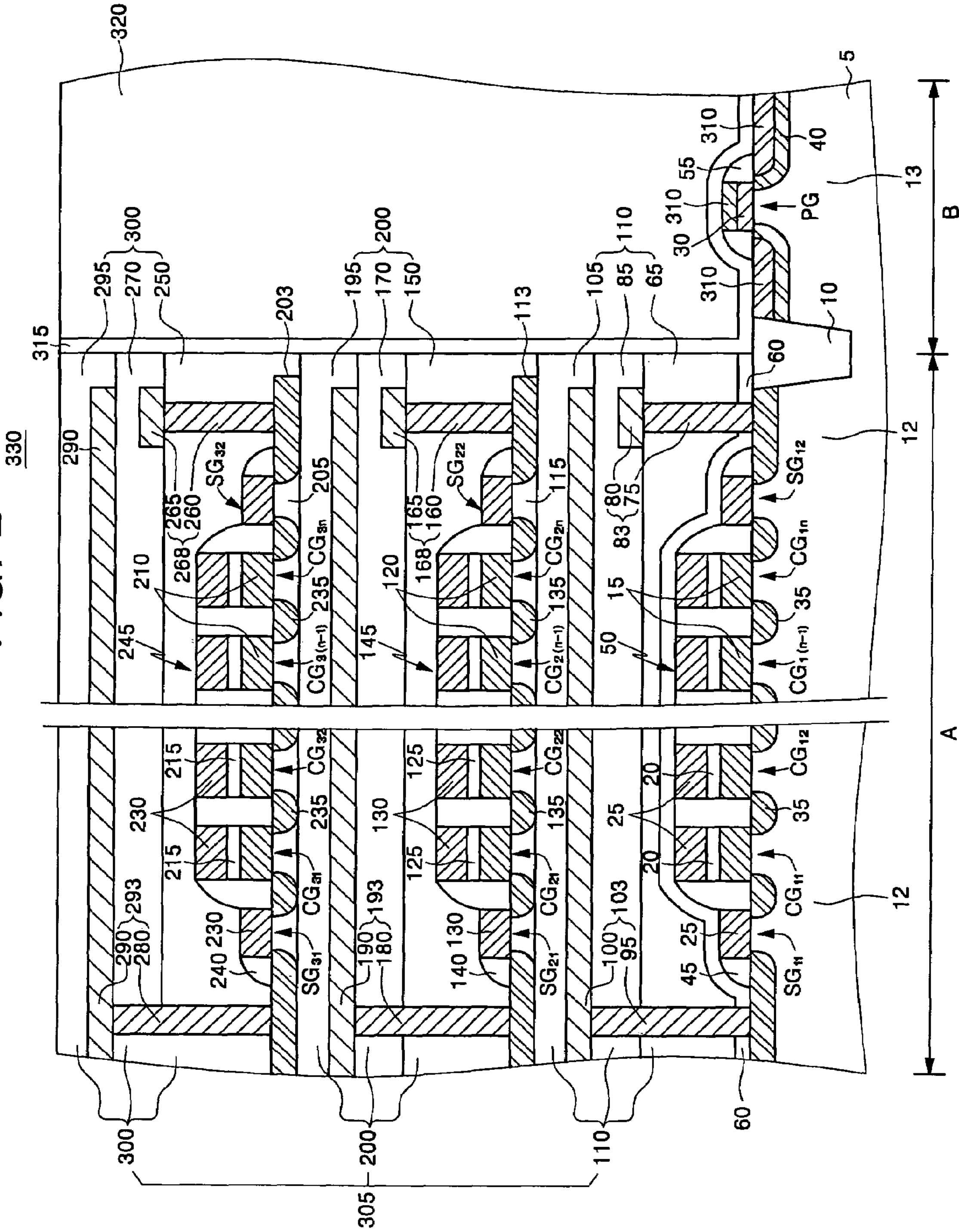
FIG. 2 is a cross-sectional view showing a non-volatile memory device according to some embodiments of the invention taken along line I-I' of FIG. 1.

FIG. 1 is a layout diagram showing a non-volatile memory device according to some embodiments of the present invention, and FIG. 2 is a cross-sectional view showing a non-volatile memory device taken along line I-I' of FIG. 1.

Referring to FIGS. 1 and 2, a device isolation layer 10 is formed between a cell array region A and a peripheral circuit region B of a semiconductor substrate 5 in which a non-volatile memory device 330 is formed. The device isolation layer 10 isolates at least one cell active region 12 of the cell array region A and at least one peripheral active region 13 of the peripheral circuit region B.

A first cell unit 50 is disposed on the at least one cell active region 12 of the cell array region A. The first cell unit 50 may include a NAND-type string having a plurality of first cell transistors $CG_{11}$, $CG_{12}$, . . . , $CG_{1(N-1)}$ and $CG_{1N}$. The first cell transistors $CG_{11}$, $CG_{12}$, . . . , $CG_{1(N-1)}$ and $CG_{1N}$ are serially connected to one another. First selective transistors $SG_{11}$ and $SG_{12}$ are disposed adjacent to the cell transistors $CG_{11}$, $CG_{12}$, . . . , $CG_{1(N-1)}$ and $CG_{1N}$. The first selective transistors $SG_{11}$ and $SG_{12}$ may function to electrically enable the first cell transistors $CG_{11}$, $CG_{12}$, . . . , $CG_{1(N-1)}$ and $CG_{1N}$.

Each of the first cell transistors $CG_{11}$, $CG_{12}$, . . . , $CG_{1(N-1)}$ and $CG_{1N}$ includes a conductive layer 15, a dielectric layer 20 and an other conductive layer 25 sequentially stacked, together with first cell source and drain regions 35 overlapping the conductive layers 15 in the at least one cell active region 12. The conductive layer 15 and the other conductive layer 25 may be a floating gate and a control gate, respectively. The first cell source and drain regions 35 may have a different conductivity type from the semiconductor substrate. Each of the first selective transistors $SG_{11}$ and $SG_{12}$ includes the other conductive layer 25 of the first cell transistors $CG_{11}$, $CG_{12}$, . . . , $CG_{1(N-1)}$ and $CG_{1N}$. However, the selective transistors $SG_{11}$ and $SG_{12}$ do not include the conductive layer 15 or the dielectric layer 20. It will be appreciated that in some embodiments of the invention, the first cell unit 50 may be formed as a NOR-type memory cell, using one of the first cell transistors $CG_{11}$, $CG_{12}$, . . . , $CG_{1(N-1)}$ and $CG_{1N}$.

A first active body layer 113 is disposed on the at least one cell active region 12. The first active body layer 113 may include a single crystalline silicon layer. The first active body layer 113 includes a first body active region 115. The first active body layer 113 may have the same conductivity type as the semiconductor substrate 5 of the cell array region A. A second cell unit 145 is disposed on and in the first body active region 115. The second cell unit 145 may include a NAND-type string having a plurality of second cell transistors $CG_{21}$, $CG_{22}$, . . . , $CG_{2(N-1)}$ and $CG_{2N}$. The second cell transistors $CG_{21}$, $CG_{22}$, . . . , $CG_{2(N-1)}$ and $CG_{2N}$ are serially connected to one another. The second selective transistors $SG_{21}$, and $SG_{22}$ are disposed adjacent to the second cell transistors $CG_{21}$, $CG_{22}$, . . . , $CG_{2(N-1)}$ and $CG_{2N}$. The second selective transistors $SG_{21}$ and $SG_{22}$ may function to electrically enable the second cell transistors $CG_{21}$, $CG_{22}$, . . . , $CG_{2(N-1)}$ and $CG_{2N}$.

Each of the second cell transistors $CG_{21}$, $CG_{22}$, . . . , $CG_{2(N-1)}$ and $CG_{2N}$ includes a conductive layer 120, a dielectric layer 125 and an other conductive layer 130 sequentially stacked, together with second cell source and drain regions 135 overlapping the conductive layer 120 in the first body active region 115. The conductive layer 120 and the other conductive layer 130 may be a floating gate and a control gate, respectively. The second cell source and drain regions 135 may have the same conductivity type as the first cell source and drain regions 35. Each of the second selective transistors $SG_{21}$ and $SG_{22}$ may include the other conductive layer 130 of the second cell transistors $CG_{21}$, $CG_{22}$, . . . , $CG_{2(N-1)}$ and $CG_{2N}$. However, the second selective transistors $SG_{21}$ and $SG_{22}$ may not include the conductive layer 120 or the dielectric layer 125. It will be appreciated that the second cell gate structure 145 may also be formed in a NOR-type memory cell, using one of the second cell transistors $CG_{21}$, $CG_{22}$, $CG_{2(N-1)}$ and $CG_{2N}$.

Referring still to FIGS. 1 and 2, second active body layer 203 is disposed on the first active body layer 113. The second active body layer 203 may include a single crystalline silicon layer. The second active body layer 203 has a second body active region 205. The second active body layer 203 may have the same conductivity type as the first active body layer 113. A third cell unit 245 is disposed on and in the second body active region 205. The third cell unit 245 may include a NAND-type string having a plurality of third cell transistors $CG_{31}$, $CG_{32}$, . . . , $CG_{3(N-1)}$ and $CG_{3N}$. The third cell transistors $CG_{31}$, $CG_{22}$, . . . , $CG_{3(N-1)}$ and $CG_{3N}$ are serially connected one another. The third selective transistors $SG_{31}$ and $SG_{32}$ are disposed to be adjacent to the third cell transistors $CG_{31}$, $CG_{32}$, . . . , $CG_{3(N-1)}$ and $CG_{3N}$. The third selective transistors $SG_{31}$ and $SG_{32}$ may function to electrically enable the third cell transistors $CG_{31}$, $CG_{32}$, . . . , $CG_{3(N-1)}$ and $CG_{3N}$.

Each of the third cell transistors $CG_{31}$, $CG_{32}$, . . . , $CG_{3(N-1)}$ and $CG_{3N}$ may include a conductive layer 210, a dielectric layer 215 and an other conductive layer 230 sequentially stacked, together with third cell source and drain regions 235 overlapping the conductive layer 210 in the second body active region 205. The conductive layer 210 and the other conductive layer 230 may form a floating gate and a control gate, respectively. The third cell source and drain regions 235 may have the same conductivity type as the second cell source and drain regions 135. Each of the third selective transistors $SG_{31}$ and $SG_{32}$ may include the other conductive layer 230 of the third cell transistors $CG_{31}$, $CG_{32}$, . . . , $CG_{3(N-1)}$ and $CG_{3N}$. However, the second selective transistors $SG_{2}$, and $SG_{22}$ may not include the conductive layer 210 or the dielectric layer 215. As will be understood by those skilled in the art, the third cell unit 245 may also be formed in a NOR-type memory cell, using one of the third cell transistors $CG_{31}$, $CG_{32}$, . . . , $CG_{3(N-1)}$ and $CG_{3N}$.

At least one peripheral transistor PG is disposed on the at least one peripheral active region 13 of the peripheral circuit region B. The at least one peripheral transistor PG includes a gate pattern 30 together with peripheral source and drain regions 40 overlapping the gate pattern 30 in the at least one peripheral active region 13. The gate pattern 30 may include the same material as the conductive layers 15, 120 and 210, or the other conductive layers 25, 130 and 230.

Metal silicide layers 310 are disposed on the gate pattern 30 and the at least one peripheral active region 13 adjacent to the gate pattern 30. The metal silicide layers 310 may overlap the peripheral source and drain regions 40. The metal silicide layers 310 may include at least one of cobalt silicide ($CoSi_2$) and/or nickel silicide ($NiSi_2$). Peripheral gate spacers 55 are disposed on sidewalls of the gate pattern 30 and the portion of the metal silicide layer 310 stacked thereon.

First cell gate spacers 45 are disposed on sidewalls of the conductive layers 15, the dielectric layers 20 and the other conductive layers 25 of the first cell transistors $CG_{11}$, $CG_{12}$, . . . , $CG_{1(N-1)}$ and $CG_{1N}$ and the first selective transistors $SG_{11}$ and $SG_{12}$. The first cell gate spacers 45 are also disposed between the first cell transistors $CG_{11}$, $CG_{12}$, . . . , $CG_{1(N-1)}$ and $CG_{1N}$ and the first selective transistors $SG_{11}$ and $SG_{12}$.

Referring still to FIGS. 1 and 2, second cell gate spacers 140 are disposed on sidewalls of the conductive layers 120, the dielectric layers 125 and the other conductive layers 130 of the second cell transistors $CG_{21}$, $CG_{22}$, . . . , $CG_{2(N-1)}$ and $CG_{2N}$ and the second selective transistors $SG_{21}$ and $SG_{22}$. The second cell gate spacers 140 are disposed between the second cell transistors $CG_{21}$, $CG_{22}$, . . . , $CG_{2(N-1)}$ and $CG_{2N}$ and the second selective transistors $SG_{21}$ and $SG_{22}$.

Third cell gate spacers 240 are disposed on sidewalls of the conductive layers 210, the dielectric layers 215 and the other conductive layers 230 of the third cell transistors $CG_{31}$, $CG_{32}$, . . . , $CG_{3(N-1)}$ and $CG_{3N}$ and the second selective transistors $SG_{31}$ and $SG_{32}$. The second cell gate spacers 140 are disposed between the third cell transistors $CG_{31}$, $CG_{32}$, . . . , $CG_{3(N-1)}$ and $CG_{3N}$ and the third selective transistors $SG_{31}$ and $SG_{32}$. The first to third cell gate spacers 45, 140 and 240, and the peripheral gate spacers 55, may include an insulating material, such as a nitride, e.g. silicon nitride.

First to third insulating layers 110, 200 and 300 are sequentially disposed on the at least one cell active region 12. The first to third insulating layers 110, 200 and 300 may include the same material. The first to third insulating layers 110, 200 and 300 are configured to expose the peripheral gate spacers 55 and the metal silicide layers 310 in the at least one peripheral active region 13. The first insulating layer 110 is configured to at least partially cover the at least one cell active region 12, the first cell unit 50 and the first cell gate spacers 45. The first insulating layer 110 may include a first lower insulating layer 65, a first middle insulating layer 85 and a first upper insulating layer 105. The first lower insulating layer 65, the first middle insulating layer 85 and the first upper insulating layer 105 may include a silicon oxide layer.

An etching stop layer 60 may be provided beneath the first insulating layer 110. The etching stop layer 60 may include material different from the first insulating layer 110. The etching stop layer 60 may include a nitride layer. The nitride layer may be a silicon nitride layer. The second insulating layer 200 is disposed on the second cell gate spacers 140 and the second cell unit 145. The second insulating layer 200 may include a second lower insulating layer 150, a second middle insulating layer 170 and a second upper insulating layer 195. The second lower insulating layer 150, the second middle insulating layer 170 and the second upper insulating layer 195 may include, for example, a silicon oxide layer.

The third insulating layer 300 is disposed on the second insulating layer 200, the third cell gate spacers 240 and the third cell unit 245. The third insulating layer 300 may include a third lower insulating layer 250, a third middle insulating layer 270 and a third upper insulating layer 295. The third lower insulating layer 250, the third middle insulating layer 270 and the third upper insulating layer 295 may include a silicon oxide. The first to third insulating layers 110, 200 and 300 may together form a cell insulating layer 305.

Still referring to FIGS. 1 and 2, an etching protection layer 315 and a peripheral insulating layer 320 are sequentially disposed on the at least one peripheral active region 13. The etching protection layer 315 may include a different material from the peripheral insulating layer 320. The peripheral insulating layer 320 may be the same material as the first to third insulating layers 110, 200 and 300. The etching protection layer 315 may at least partially cover the peripheral gate spacers 55 and the metal silicide layers 310. The etching protection layer 315 may include a nitride layer, such as a silicon nitride layer. The etching protection layer 315 may also be provided between the cell and peripheral insulating layers 305 and 320, between the peripheral gate spacers 55 and the peripheral insulating layer 320 and between the metal silicide layers 310 and the peripheral insulating layer 320.

First source and bit lines 83 and 103 are disposed in the first insulating layer 110. The first source and bit lines 83 and 103 are disposed adjacent to the first selective transistors $SG_{11}$ and $SG_{12}$. The first source line 83 includes a first source conductive plug 75 and a first source conductive line 80. The first source conductive plug 75 penetrates the first lower insulating layer 65 adjacent to the first selective transistor $SG_{12}$ and contacts the at least one cell active region 12. Accordingly, the first source conductive plug 75 may contact the first cell source and drain regions 35. The first source conductive line 80 is disposed between the first lower and middle insulating layers 65 and 85 and contacts the first source conductive plug 75.

The first bit line 103 includes a first bit conductive plug 95 and a first bit conductive line 100. The first bit conductive plug 95 penetrates the first lower and middle insulating layers 65 and 85 adjacent to the first selective transistor $SG_{11}$ and contacts the at least one cell active region 12. The first bit conductive line 100 is disposed between the first middle and upper insulating layers 85 and 105 and contacts the first bit conductive plug 95.

Second source and bit lines 168 and 193 are disposed in the second insulating layer 200. The second source and bit lines 168 and 193 are disposed adjacent to the second selective transistors $SG_{21}$ and $SG_{22}$. The second source line 168 includes a second source conductive plug 160 and a second source conductive line 165. The second source conductive plug 160 penetrates the second lower insulating layer 150 adjacent to the second selective transistor $SG_{22}$ and contacts the first body active region 115. Accordingly, the second source conductive plug 160 may contact the second cell source and drain regions 135. The second source conductive line 165 is disposed between the second lower and middle insulating layers 150 and 170 and contacts the second source conductive plug 160.

The second bit line 193 includes a second bit conductive plug 180 and a second bit conductive line 190. The second bit conductive plug 180 penetrates the second lower and middle insulating layers 150 and 170 adjacent to the second selective transistor $SG_{21}$ and contacts the first body active region 115. The second bit conductive line 190 is disposed between the second middle and upper insulating layers 170 and 195 and contacts the second bit conductive plug 180.

Still referring to FIGS. 1 and 2, third source and bit lines 268 and 293 are disposed in the third insulating layer 300. The third source and bit lines 268 and 293 are disposed adjacent to the third selective transistors $SG_{31}$ and $SG_{32}$. The third source line 268 includes a third source conductive plug 260 and a third source conductive line 265. The third source conductive plug 260 penetrates the third lower insulating layer 250 adjacent to the third selective transistor $SG_{32}$ and contacts the second body active region 205. Accordingly, the third source conductive plug 260 may contact the third cell source and drain regions 235. The third source conductive line 265 is disposed between the third lower and middle insulating layers 250 and 270 and contacts the third source conductive plug 260.

The third bit line 293 includes a third bit conductive plug 280 and a third bit conductive line 290. The third bit conductive plug 280 penetrates the third lower and middle insulating layers 250 and 270 adjacent to the third selective transistor $SG_{31}$ and contacts the second body active region 205. The third bit conductive line 290 is disposed between the third middle and upper insulating layers 270 and 295 and contacts the third bit conductive plug 280.

Metal contact holes 325 may be disposed in the peripheral insulating layer 320 to contact the peripheral source and drain regions 40, as shown in FIG. 1. The metal contact holes 325 may be filled with conductive plugs (not shown), respectively. Metal lines (not shown) may be disposed on the conductive plugs.

Methods of forming non-volatile memory devices according to some embodiments of the present invention will now be described with reference to the accompanying drawings.

FIGS. 3 to 11 are cross-sectional views illustrating methods of forming non-volatile memory devices according to some embodiments of the invention taken along line I-I' of FIG. 1, respectively.

Figure 3:
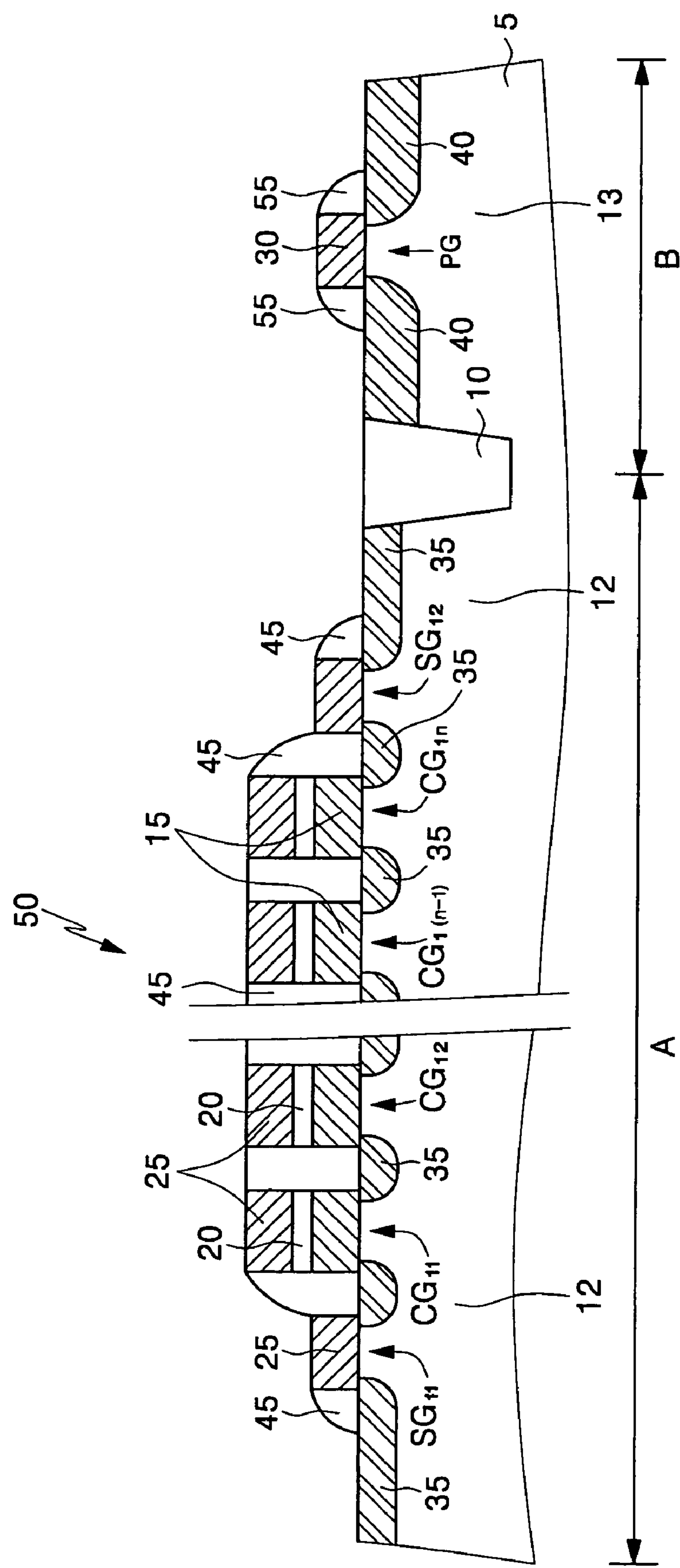
FIGS. 3 to 11 are cross-sectional views illustrating methods of forming non-volatile memory devices according to some embodiments of the invention taken along line I-I' of FIG. 1, respectively.

Referring to FIGS. 1 and 3, a semiconductor substrate 5 having a cell array region A and a peripheral circuit region B is provided. A device isolation layer 10 is formed between the cell array region A and the peripheral circuit region B of the semiconductor substrate 5. The device isolation layer 10 may be formed to isolate at least one cell active region 12 of the cell array region A and at least one peripheral active region 13 of the peripheral circuit region B.

A plurality of first cell transistors $CG_{11}$, $CG_{12}$, . . . , $CG_{1(N-1)}$ and $CG_{1N}$ are formed from the left side to the right side on the at least one cell active region 12. Each of the first cell transistors $CG_{11}$, $CG_{12}$, . . . , $CG_{1(N-1)}$ and $CG_{1N}$ comprises a conductive layer 15, a dielectric layer 20 and an other conductive layer 25 sequentially stacked. The conductive layer 15 and the other conductive layer 25 may be a floating gate and a control gate, respectively. The first cell transistors $CG_{11}$, $CG_{12}$, . . . , $CG_{1(N-1)}$ and $CG_{1N}$ may constitute a first cell unit 50. Accordingly, the first cell unit 50 may be formed as a NAND-type string. However, the first cell unit 50 may also be formed as a NOR-type memory cell, using one of the the first cell transistors $CG_{11}$, $CG_{12}$, . . . , $CG_{1(N-1)}$ and $CG_{1N}$, as well known to those of ordinary skill in the art.

Referring still to FIGS. 1 and 3, first selective transistors $SG_{11}$ and $SG_{12}$ are formed adjacent to the first cell gate patterns $CG_{11}$ and $CG_{1N}$, respectively. The first selective transistors $SG_{11}$ and $SG_{12}$ includes the other conductive layer 25 of the first cell transistors $CG_{11}$, $CG_{12}$, . . . , $CG_{1(N-1)}$ and $CG_{1N}$.

At least one peripheral transistor PG is formed on the at least one peripheral active region 13. The at least one peripheral transistor PG includes a gate pattern 30. The gate pattern 30 may have the same conductivity type as the conductive layer 15 or the other conductive layer 25. The at least one peripheral transistor PG may be formed simultaneously with the first cell transistors $CG_{11}$, $CG_{12}$, . . . , $CG_{1(N-1)}$ and $CG_{1N}$.

The at least one peripheral transistor PG, and the first cell transistors $CG_{11}$, $CG_{12}$, . . . , $CG_{1(N-1)}$ and $CG_{1N}$ may also be formed in different steps.

Still referring to FIGS. 1 and 3, each of the first cell transistors $CG_{11}$, $CG_{12}$, . . . , $CG_{1(N-1)}$ and $CG_{1N}$, and the first selective transistors $SG_{11}$ and $SG_{12}$ may further include first cell source and drain regions 35. The first cell source and drain regions 35 are formed in the at least one cell active region 12 to overlap the conductive layer 15 of the respective first cell transistors $CG_{11}$, $CG_{12}$, . . . , $CG_{1(N-1)}$ and $CG_{1N}$, and the other conductive layer 25 of the respective first selective transistors $SG_{11}$ and $SG_{12}$. The first cell source and drain regions 35 may have a different conductivity type from the semiconductor substrate 5. The peripheral transistor PG may further include peripheral source and drain regions 40. The peripheral source and drain regions 40 may be formed in the at least one peripheral active region 13 to overlap the gate pattern 30.

The peripheral source and drain regions 40 may have an LDD (Lightly Doped Drain) profile. The peripheral source and drain regions 40 may have the same conductivity type as the first cell source and drain regions 35 in some embodiments. However, the peripheral source and drain regions 40 may be formed simultaneously with the first cell source and drain regions 35. The peripheral source and drain regions 40 and the first cell source and drain regions 35 may also be formed in different steps.

Still referring to FIGS. 1 and 3, first cell gate spacers 45 are formed on sidewalls of the conductive layers 15, the dielectric layers 20 and the other conductive layers 25 in the at least one cell active region 12. The first cell gate spacers 45 may be formed to fill spaces between the first cell transistor $CG_{11}$, $CG_{12}$, . . . , $CG_{1(N-1)}$ and $CG_{1N}$ and the first selective transistor $SG_{11}$ and $SG_{12}$. Peripheral gate spacers 55 are formed on sidewalls of the gate pattern 30 in the at least one peripheral active region 13. The first cell gate spacers 45 and the peripheral gate spacers 55 may be formed using an insulating material such as a nitride, e.g. silicon nitride. The first cell gate spacers 45 may be formed simultaneously with the peripheral gate spacers 55 in some embodiments. However, in some embodiments, the first cell gate spacers 45 and the peripheral gate spacers 55 may be formed in different steps.

Figure 4:
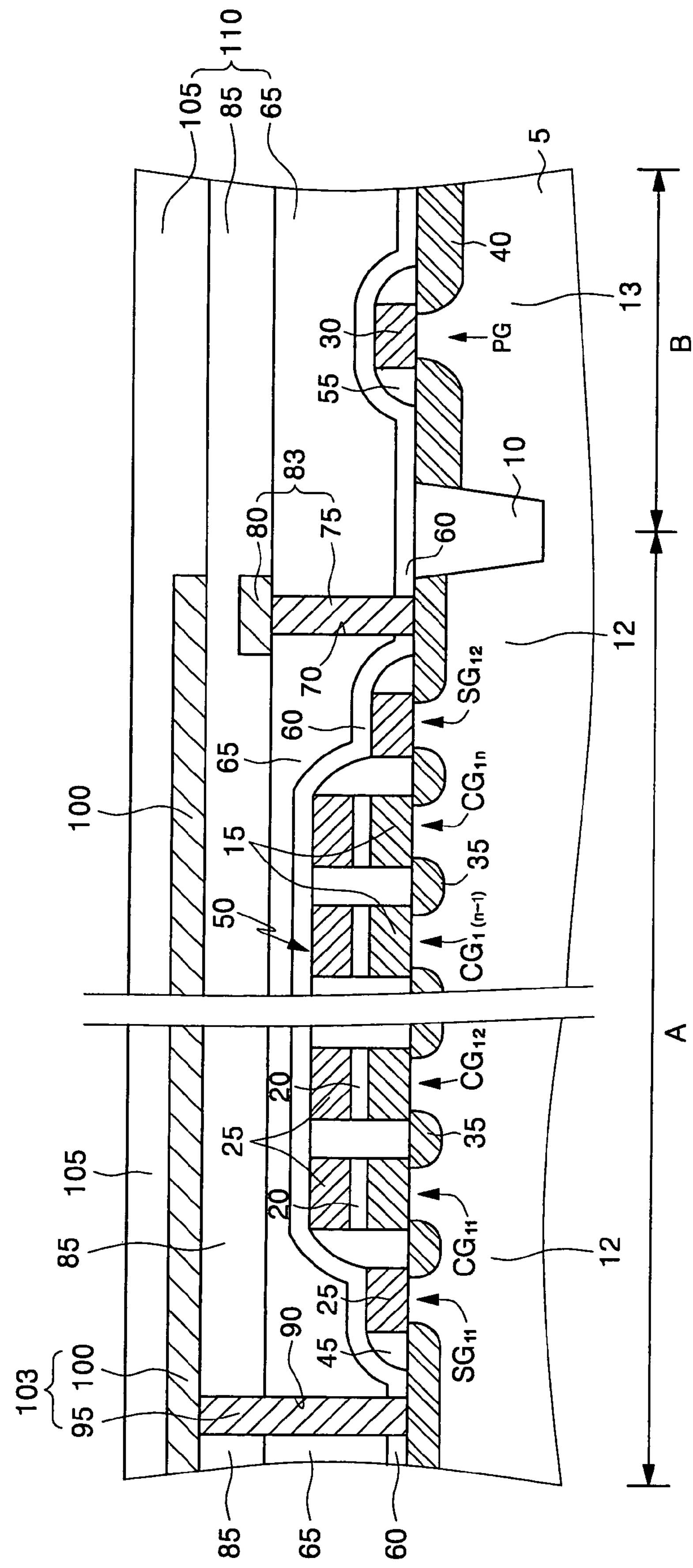

Referring to FIGS. 1 and 4, an etching stop layer 60 and a first lower insulating layer 65 are sequentially formed on the device isolation layer 10, the at least one cell active region 12 and the at least one peripheral active region 13. At this time, the etching stop layer 60 may be formed to cover the first selective transistor $SG_{11}$ and $SG_{12}$, the peripheral transistor PG, the first cell gate spacers 45, the first cell unit 50, and the peripheral gate spacers 55. The etching stop layer 60 may include a nitride layer, such as a silicon nitride layer. The first lower insulating layer 65 may include a material different from the etching stop layer 60. For example, the first lower insulating layer 65 may be formed of silicon oxide.

A first source hole 70 is formed to sequentially penetrate the first lower insulating layer 65 and the etching stop layer 60. The first source hole 70 may be formed to expose one of the first cell source/drain regions 35. That is, the first source hole 70 may be formed on the first cell source and drain region 35 overlapping the the first selective gate $SG_{12}$. The first source hole 70 is filled with a first source conductive plug 75.

Referring still to FIGS. 1 and 4, a first source conductive line 80 is formed on the first lower insulating layer 65 to contact the first source conductive plug 75. The first source conductive plug 75 and the first source conductive line 80 may form a first source line 83. A first middle insulating layer 85 is formed on the first lower insulating layer 65 to at least partially cover the first source line 83. The first middle insulating layer 85 may include the same material as the first lower insulating layer 65.

A first bit hole 90 is formed to penetrate the first lower and middle insulating layers 65 and 85. The first bit hole 90 may be formed to expose one of the first cell source and drain regions 35. For example, the first bit hole 90 may be formed on a first cell source/drain region 35 overlapping the first selective gate $SG_{11}$. The first bit hole 90 is filled with a first bit conductive plug 95.

A first bit conductive line 100 is formed on the first middle insulating layer 85 to contact the first bit conductive plug 95. The first bit conductive plug 95 and the first bit conductive line 100 may form a first bit line 103. A first upper insulating layer 105 is formed on the first middle insulating layer 85 to cover the first bit conductive line 100. The first upper insulating layer 105 may include the same material as the first middle insulating layer 85. Hereinafter, the first lower, middle and upper insulating layers 65, 85 and 105 are referred to as the first insulating layer 110.

Figure 5:
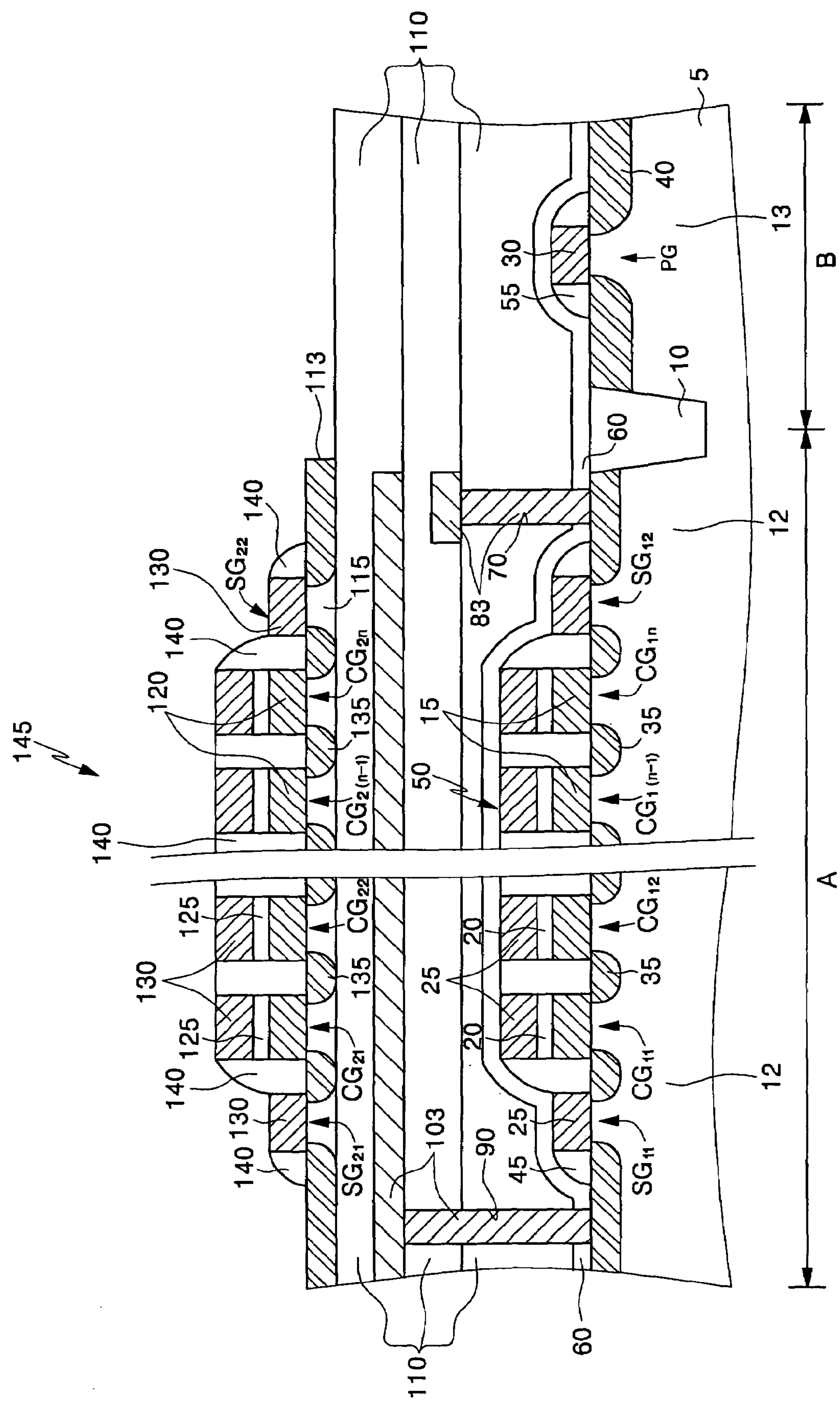

Referring to FIGS. 1 and 5, a first active body layer 113 is formed on the first insulating layer 110. The first active body layer 113 is formed to at least partially overlap the at least one cell active region 12. The first active body layer 113 is formed to have a first body active region 115. The first active body layer 113 may be formed to have the same conductivity type as the semiconductor substrate 5. The first active body layer 113 may be formed as a single crystalline silicon layer. A plurality of second cell transistors $CG_{21}$, $CG_{22}$, . . . , $CG_{2(N-1)}$ and $CG_{2N}$ are formed from the left side to the right side on the first body active region 115.

Each of the second cell transistors $CG_{21}$, $CG_{22}$, . . . , $CG_{2(N-1)}$ and $CG_{2N}$ includes a conductive layer 120, a dielectric layer 125 and an other conductive layer 130 sequentially stacked. The conductive layer 120 and the other conductive layer 130 may form a floating gate and a control gate, respectively. The second cell transistors $CG_{21}$, $CG_{22}$, . . . , $CG_{2(N-1)}$ and $CG_{2N}$ constitute a second cell unit 145. Accordingly, the second cell unit 145 may have a NAND-type memory cell structure. However, the second cell unit 145 may alternately have a NOR-type memory cell structure, using one of second cell transistors $CG_{21}$, $CG_{22}$, . . . , $CG_{2(N-1)}$ and $CG_{2N}$, as well known to those of ordinary skill in the art.

Referring still to FIGS. 1 and 5, second selective transistors $SG_{21}$ and $SG_{22}$ are formed adjacent to the second cell transistors $CG_{21}$ and $CG_{2N}$, respectively. The second selective transistors $SG_{21}$ and $SG_{22}$ include the other conductive layer 130 of the second cell transistors $CG_{21}$, $CG_{22}$, . . . , $CG_{2(N-1)}$ and $CG_{2N}$. The second cell transistors $CG_{21}$, $CG_{22}$, . . . , $CG_{2(N-1)}$ and $CG_{2N}$, and the second selective transistors $SG_{21}$ and $SG_{22}$ may further include second cell source and drain regions 135. The second cell source and drain regions 135 are formed in the first body active region 115 to overlap the conductive layer 120 of the respective second cell transistors $CG_{21}$, $CG_{22}$, . . . , $CG_{2(N-1)}$ and $CG_{2N}$, and the other conductive layer 130 of the respective second selective transistors $SG_{21}$ and $SG_{22}$. The second cell source and drain regions 135 may be formed to have a different conductivity type from the first active body layer 113.

Second cell gate spacers 140 are formed on sidewalls of the conductive layers 120, the dielectric layers 125 and the other conductive layers 130. The second cell gate spacers 140 may be formed between the second cell transistors $CG_{21}$, $CG_{22}$, . . . , $CG_{2(N-1)}$ and $CG_{2N}$, and the second selective transistor $SG_{21}$ and $SG_{22}$. The second cell gate spacers 140 may be formed in insulating material such as a nitride, e.g. silicon nitride.

Figure 6:
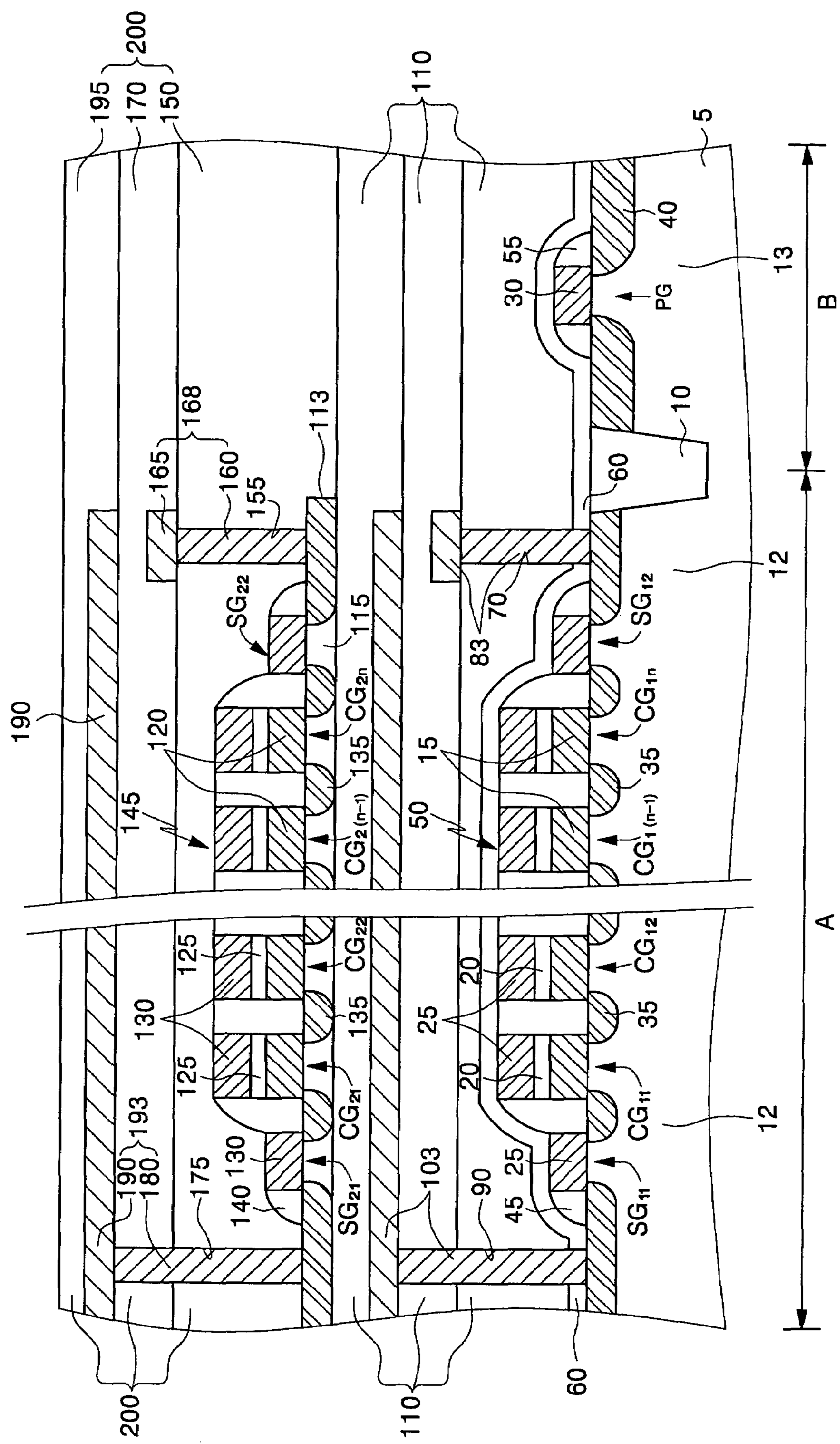

Referring to FIGS. 1 and 6, a second lower insulating layer 150 is formed on the first insulating layer 110 and the first body active region 115. The second lower insulating layer 150 may be formed to at least partially cover the second selective transistors $SG_{21}$ and $SG_{22}$, the second cell gate spacers 140 and the second cell unit 145. The second lower insulating layer 150 may be formed of the same material as the first insulating layer 110.

A second source hole 155 is formed to penetrate the second lower insulating layer 150. The second source hole 155 may be formed to at least partially expose one of the second cell source/drain regions 135. That is, the second source hole 155 may be formed over one of the second cell source/drain regions 135 overlapping the the second selective transistor $SG_{22}$. The second source hole 155 is filled with a second source conductive plug 160.

Referring still to FIGS. 1 and 6, a second source conductive line 165 is formed on the second lower insulating layer 150 to contact the second source conductive plug 160. The second source conductive plug 160 and the second source conductive line 165 may form a second source line 168. A second middle insulating layer 170 may be formed on the second lower insulating layer 150 to cover the second source line 168. The second middle insulating layer 170 may be formed of the same material as the second lower insulating layer 150.

A second bit hole 175 is formed to penetrate the second lower and middle insulating layers 150 and 170. The second bit hole 175 may be formed to expose at least a portion of the second cell source and drain regions 135. That is, the second bit hole 175 may formed on a second cell source/drain region 135 overlapping the second selective transistor $SG_{21}$. The second bit hole 175 may be filled with a second bit conductive plug 180.

Still referring to FIGS. 1 and 6, a second bit conductive line 190 is formed on the second middle insulating layer 170 to contact the second bit conductive plug 180. The second bit conductive plug 180 and the second bit conductive line 190 may form a second bit line 193. A second upper insulating layer 195 is formed on the second middle insulating layer 170 to at least partially cover the second bit conductive line 190. The second upper insulating layer 195 may include the same material as the second middle insulating layer 170. Hereinafter, the second lower, middle and upper insulating layers 150, 170 and 195 are referred to as the second insulating layer 200.

Figure 7:
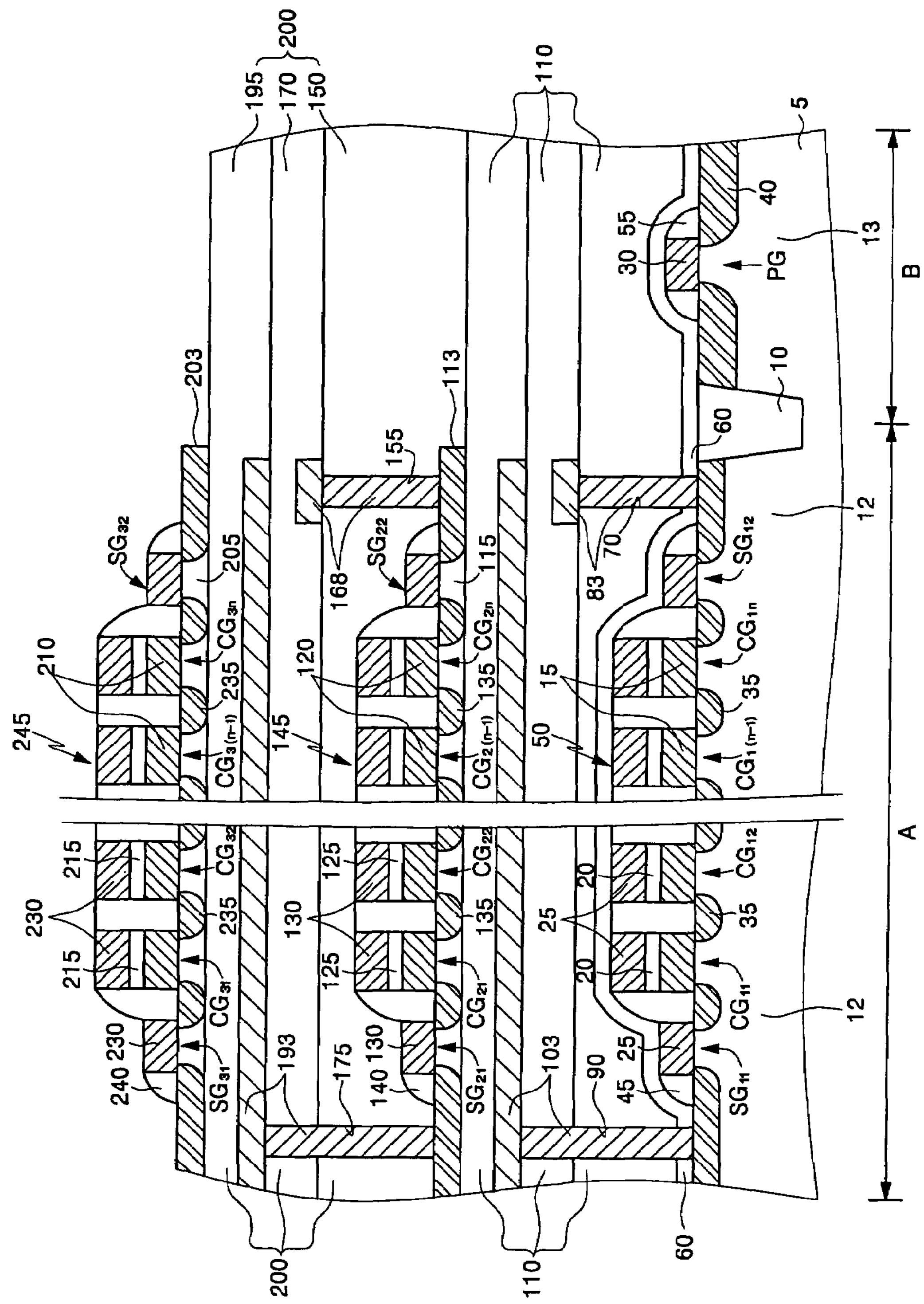

Referring now to FIGS. 1 and 7, a second active body layer 203 is formed on the second insulating layer 200. The second active body layer 203 is formed to overlap the first body active region 115. The second active body layer 203 is formed to have a second body active region 205. The second body active region 205 may be formed to have the same conductivity type as the first body active region 115. The second active body layer 203 may be formed as a single crystalline silicon layer. A plurality of third cell transistors $CG_{31}$, $CG_{32}$, . . . , $CG_{3(N-1)}$ and $CG_{3N}$ are formed from the left side to the right side on the second body active region 205.

Each of the third cell transistors $CG_{31}$, $CG_{32}$, . . . , $CG_{3(N-1)}$ and $CG_{3N}$ may include a conductive layer 210, a dielectric layer 215 and an other conductive layer 230 sequentially stacked. The conductive layer 210 and the other conductive layer 230 may form a floating gate and a control gate, respectively. The third cell transistors $CG_{31}$, $CG_{32}$, . . . , $CG_{3(N-1)}$ and $CG_{3N}$ may constitute a third cell unit 245. Accordingly, the third cell unit 245 may have a NAND-type memory cell structure in some embodiments. However, the third cell unit 245 may also be formed to have a NOR-type memory cell structure, using one of the third cell transistors $CG_{31}$, $CG_{32}$, . . . , $CG_{3(N-1)}$ and $CG_{3N}$, as well known to those of ordinary skill in the art.

Referring still to FIGS. 1 and 7, third selective transistors $SG_{31}$ and $SG_{32}$ are formed to be adjacent to the third cell transistors $CG_{31}$ and $CG_{3N}$, respectively. The third selective transistors $SG_{31}$ and $SG_{32}$ include the other conductive layer 230 of the third cell transistors $CG_{31}$, $CG_{32}$, . . . , $CG_{3(N-1)}$ and $CG_{3N}$. The third cell transistors $CG_{31}$, $CG_{32}$, . . . , $CG_{3(N-1)}$ and $CG_{3N}$, and third selective transistors $SG_{31}$ and $SG_{32}$ further include third cell source and drain regions 235. The third cell source and drain regions 235 are formed in the second body active region 205 to overlap the conductive layer 210 of the respective third cell transistors $CG_{31}$, $CG_{32}$, . . . , $CG_{3(N-1)}$ and $CG_{3N}$, and the other conductive layer 230 of the respective third selective transistors $SG_{31}$ and $SG_{32}$. The third cell source and drain regions 235 may be formed to have a different conductivity type from the second active body layer 203.

Third cell gate spacers 240 are formed on sidewalls of the conductive layers 210, the dielectric layers 215 and the other conductive layers 230. The third cell gate spacers 240 may be formed between the third cell transistors $CG_{31}$, $CG_{32}$, . . . , $CG_{3(N-1)}$ and $CG_{3N}$, and third selective transistors $SG_{31}$ and $SG_{32}$. The third cell gate spacers 240 may be formed of an insulating material such as nitride, e.g. silicon nitride.

Figure 8:
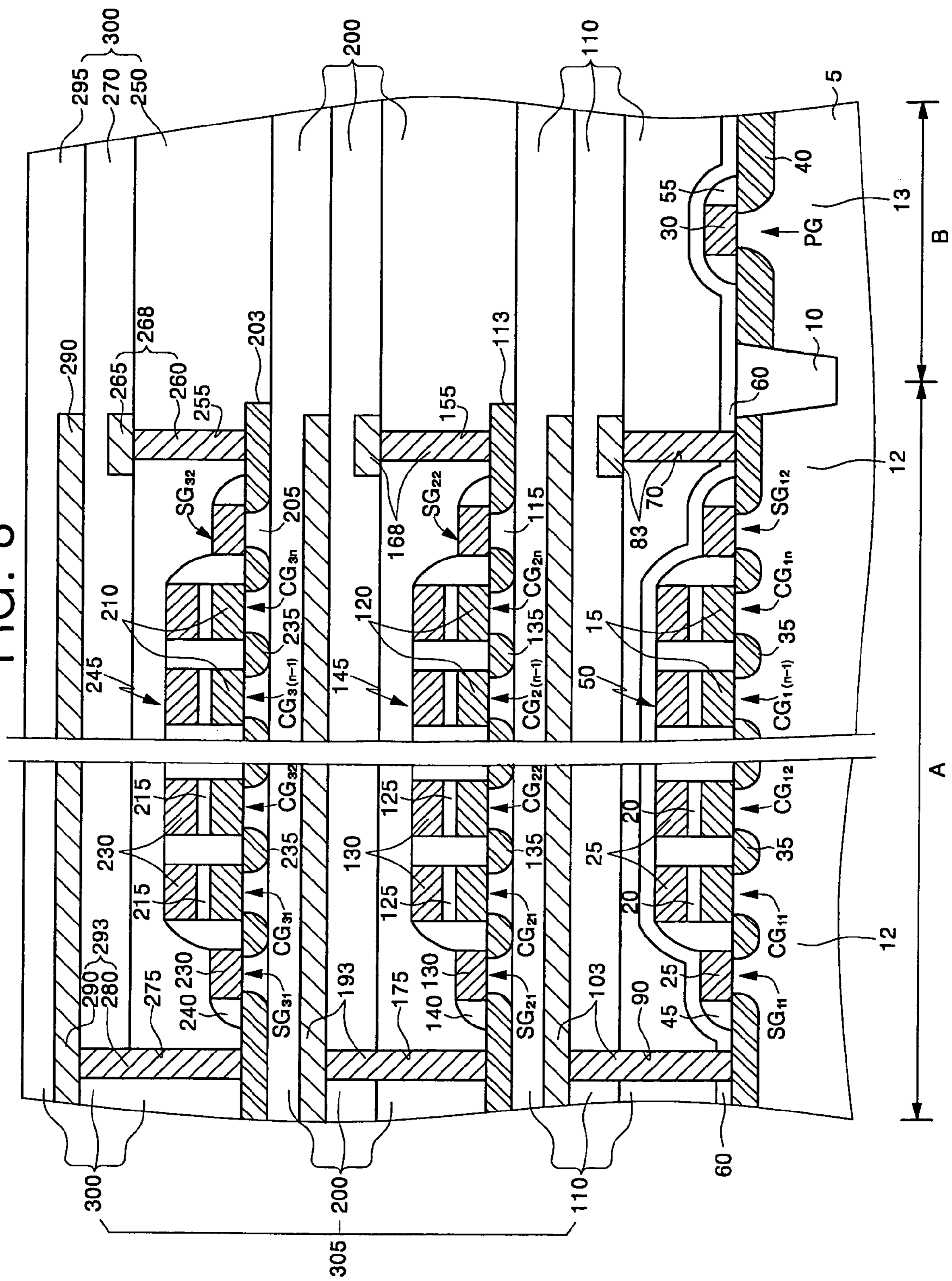

Referring to FIGS. 1 and 8, a third lower insulating layer 250 is formed on the second insulating layer 200 and the second body active region 205. The third lower insulating layer 250 may be formed to at least partially cover the third selective transistor $SG_{31}$ and $SG_{32}$, the third cell gate spacers 240 and the third cell unit 245. The third lower insulating layer 250 may include the same material as the second insulating layer 200.

A third source hole 255 is formed to penetrate the third lower insulating layer 250. The third source hole 255 may be formed to at least partially expose one of the third cell source/drain regions 235. That is, the third source hole 255 may formed on a third cell source/drain region 235 overlapping the third selective transistor $SG_{32}$. The third source hole 255 may be filled with a third source conductive plug 260.

Referring still to FIGS. 1 and 8, a third source conductive line 265 is formed on the third lower insulating layer 250 to contact the third source conductive plug 260. The third source conductive plug 260 and the third source conductive line 265 may form a third source line 268. A third middle insulating layer 270 is formed on the third lower insulating layer 250 to at least partially cover the third source line 268. The third middle insulating layer 270 may be formed of the same material as the third lower insulating layer 250.

A third bit hole 275 is formed to penetrate the third lower and middle insulating layers 250 and 270. The third bit hole 275 may be formed to at least partially expose one of the third cell source/drain regions 235. That is, the third bit hole 275 may formed on a third cell source/drain region 235 overlapping the third selective transistor $SG_{31}$. The third bit hole 275 may be filled with a third bit conductive plug 280.

Still referring to FIGS. 1 and 8, a third bit conductive line 290 is formed on the third middle insulating layer 270 to contact the third bit conductive plug 280. The third bit conductive plug 280 and the third bit conductive line 290 may form a third bit line 293. A third upper insulating layer 295 is formed on the third middle insulating layer 270 to at least partially cover the third bit conductive line 290. The third upper insulating layer 295 may include the same material as the third middle insulating layer 270. Hereinafter, the third lower, middle and upper insulating layers 250, 270 and 295 are referred to as the third insulating layer 300. Further, the first to third insulating layers 110, 200 and 300 form a cell insulating layer 305.

Figure 9:
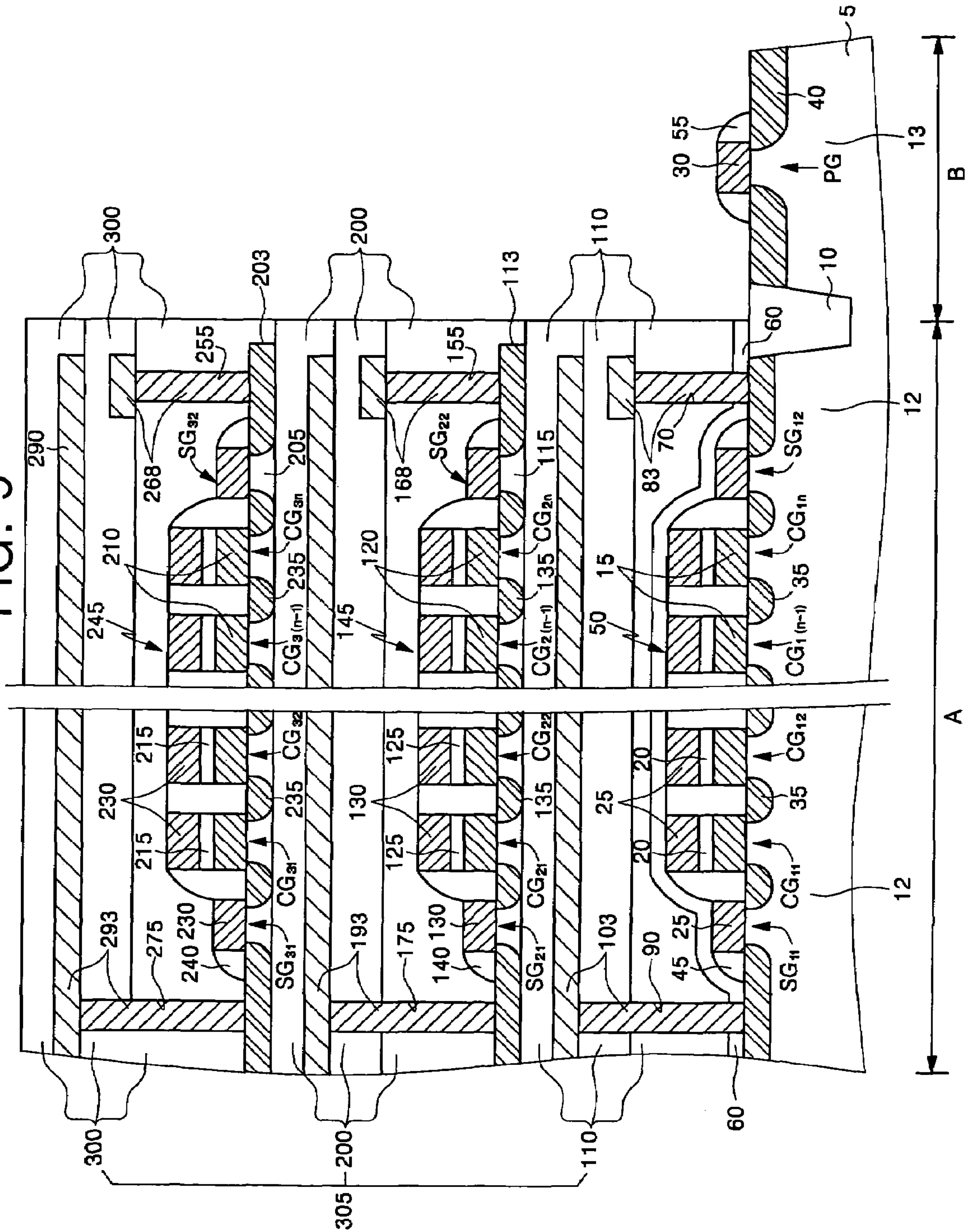

Referring to FIGS. 1 and 9, the cell insulating layer 305 may be etched, using the etching stop layer 60 as an etch-retarding layer, to at least partially expose the device isolation layer 10 and the at least one peripheral active region 13. As such, the peripheral transistor PG and the peripheral gate spacers 55 may be exposed through the cell insulating layer 305. In some embodiments, the peripheral transistor PG and the peripheral gate spacers 55 may be sequentially formed on the at least one peripheral active region 13 after etching the cell insulating layer 305.

Figure 10:
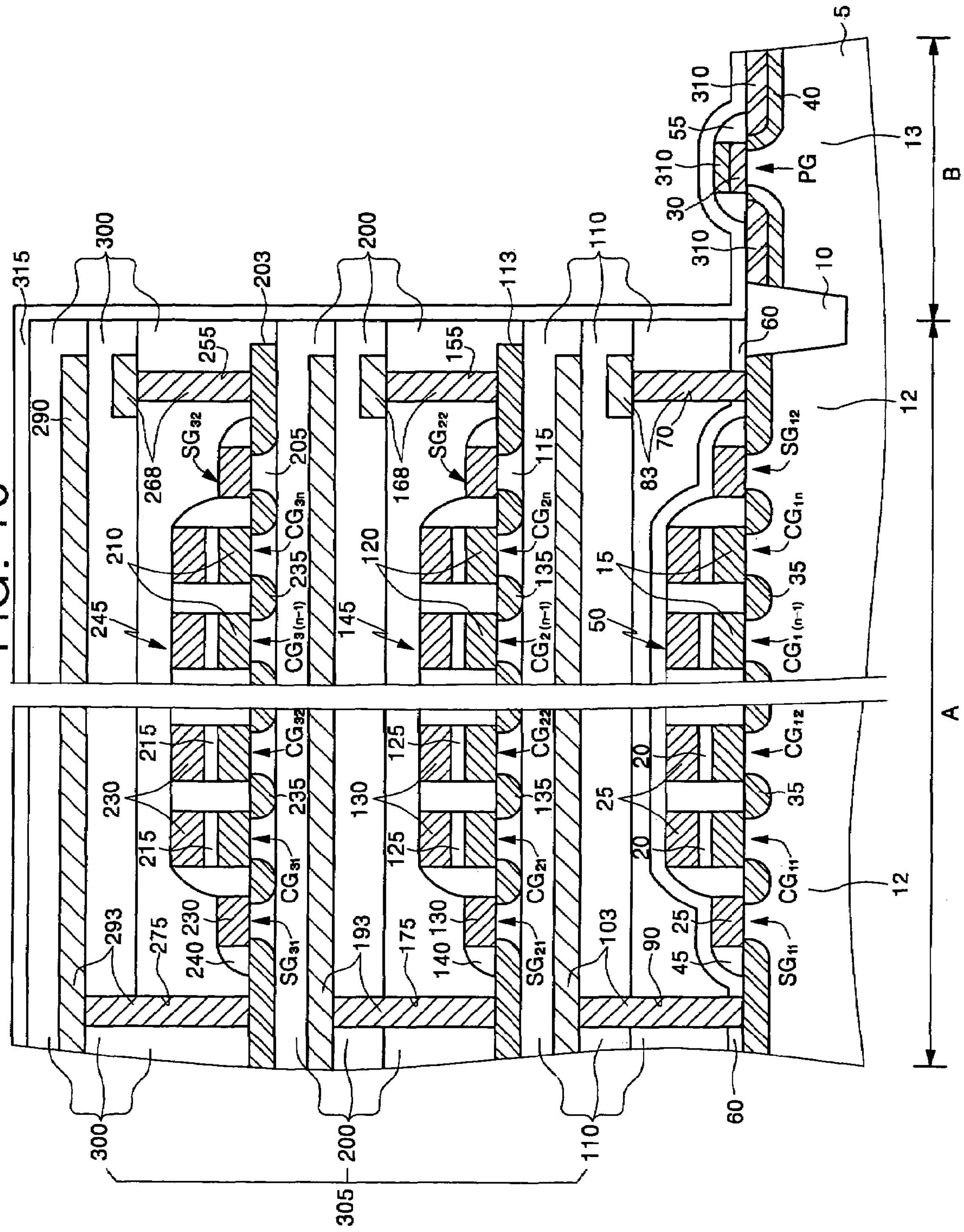

Referring to FIGS. 1 and 10, metal silicide layers 310 are formed in the at least one peripheral active region 13 and the gate pattern 30 using the peripheral gate spacers 55 and the cell insulating layer 305 as a mask. The metal silicide layers 310 may be surrounded by the peripheral source and drain regions 40 in the at least one peripheral active region 13. The metal silicide layers 310 may include cobalt silicon ($CoSi_2$) and/or nickel silicon ($NiSi_2$). During the formation of the metal silicide layers 310, the cell insulating layer 305 may protect the first to third cell units 50, 145 and 245 from being subjected to contamination by the metal silicide layers 310 .

An etching protection layer 315 is formed on the at least one peripheral active region 13 and the cell insulating layer 305. The etching protection layer 315 may be formed to at least partially cover the peripheral gate spacers 55 and the metal silicide layers 310. The etching protection layer 315 may include a nitride , such as silicon nitride.

Figure 11:
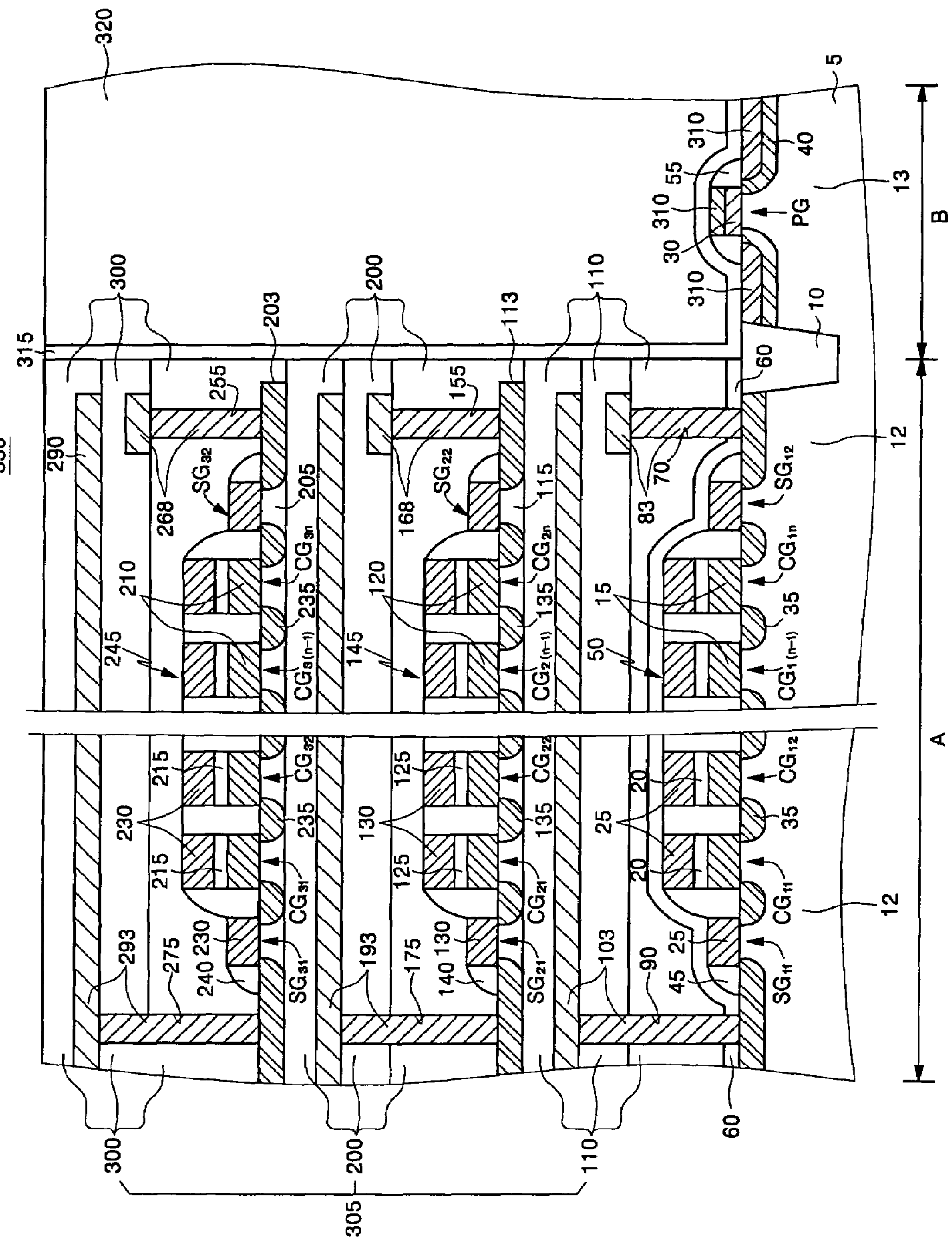

Referring to FIGS. 1 and 11, a peripheral insulating layer 320 is formed on the etching protection layer 315. The peripheral insulating layer 320 may include the same material as the cell insulating layer 305. The peripheral insulating layer 320 and the etching protection layer 315 may be sequentially etched to expose an upper surface of the cell insulating layer 305. After etching the etching protection layer 315 and the peripheral insulating layer 320, the etching protection layer 315 may remain between the peripheral gate spacers 55 and the peripheral insulating layer 320, between the cell and peripheral insulating layers 305 and 320, and between the metal silicide layers 310 and the peripheral insulating layer 320.

Referring to FIG. 1, metal contact holes 325 are formed in the peripheral insulating layer 320 to expose the peripheral source and drain regions 40. The metal contact holes 325 may be filled with conductive plugs (not shown), respectively. Metal lines (not shown) may be formed on the conductive plugs. Hereinafter, well-known semiconductor fabrication processes may be performed on the metal lines, the cell insulating layer 305 and the peripheral insulating layer 320, to form a non-volatile memory device 330.

As described the above, some embodiments of the present invention provide techniques for performing a silicide process on a peripheral transistor of a peripheral circuit region when cell transistors are vertically stacked on a cell array region of a semiconductor substrate. Consequently, some embodiments of the present invention can enhance the electrical characteristics of a non-volatile memory device employing a silicide process.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A non-volatile memory device, comprising:
- a semiconductor substrate including a cell array region and a peripheral circuit region;
- a first cell unit on the semiconductor substrate in the cell array region;
- a cell insulating layer on the first cell unit;
- a first active body layer in the cell insulating layer and over the first cell unit;
- a second cell unit on the first active body layer;
- a peripheral transistor on the semiconductor substrate in the peripheral circuit region, the peripheral transistor having a gate pattern and source/drain regions;
- a metal silicide layer on the gate pattern and/or on the source/drain regions of the peripheral transistor;
- a peripheral insulating layer on the metal silicide layer and the peripheral transistor; and
- an etching protection layer between the cell insulating layer and the peripheral insulating layer and between the metal silicide layer and the peripheral insulating layer.

2. The non-volatile memory device of claim 1, wherein each of the first and second cell units comprises a NAND-type string including a plurality of serially connected cell transistors.

3. The non-volatile memory device of claim 1, wherein each of the first and second cell units comprises a NOR-type memory cell.

4. The non-volatile memory device of claim 1, wherein the first active body layer has the same conductivity type as the semiconductor substrate in the cell array region.

5. The non-volatile memory device of claim 1, wherein the metal silicide layer comprises cobalt silicide ($CoSi_2$) and/or nickel silicide ($NiSi_2$).

6. The non-volatile memory device of claim 1, wherein the etching protection layer comprises a nitride layer.

7. The non-volatile memory device of claim 6, wherein the nitride layer comprises silicon nitride.

8. The non-volatile memory device of claim 1, further comprising:
- a second active body layer in the cell insulating layer and arranged over the second cell unit; and
- a third cell unit on the second active body layer and covered by the cell insulating layer.

9. The non-volatile memory device of claim 8, wherein each of the first to third cell units comprises a NAND-type string including a plurality of serially connected cell transistors.

10. The non-volatile memory device of claim 8, wherein each of the first to third cell units comprises a NOR-type memory cell.

11. A method of forming a non-volatile memory device, comprising:
- providing a semiconductor substrate having a cell array region and a peripheral circuit region;
- forming a first cell unit on the semiconductor substrate in the cell array region and a peripheral transistor on the semiconductor substrate in the peripheral region;
- forming a first insulating layer on the first cell unit and the peripheral transistor;
- forming a first active body layer on the first insulating layer in the cell array region;
- forming a second cell unit on the first active body layer;
- forming a second insulating layer on the second cell unit and the first insulating layer;
- patterning the first and second insulating layers to expose the peripheral transistor;

forming a metal silicide layer on a gate pattern and/or on source/drain regions of the peripheral transistor; and forming a peripheral insulating layer on the metal silicide layer and the peripheral transistor.

12. The method of claim 11, further comprising;

forming an etching stop layer on the first cell unit and on the peripheral transistor prior to forming the first insulating layer; and removing the etching stop layer in the peripheral circuit region after patterning the first and second insulating layers.

13. The method of claim 11, wherein the etching stop layer comprises a nitride layer.

14. The method of claim 11, further comprising forming an etching protection layer on the metal silicide layer prior to forming the peripheral insulating layer.

15. The method of claim 11, wherein the etching protection layer comprises a nitride layer.

16. The method of claim 11, wherein the metal silicide layer comprises cobalt silicide ($CoSi_2$) and/or nickel silicide ($NiSi_2$).

17. The method of claim 11, wherein each of the first and second cell units comprises a NAND-type string including a plurality of serially connected cell transistors.

18. The method of claim 11, wherein each of the first and second cell units comprises a NOR-type memory cell.

19. The method of claim 11, further comprising:

forming a second active body layer on the second insulating layer in the cell array region before patterning the first and second insulating layers;

forming a third cell unit on the second active body layer; and forming a third insulating layer on the third cell unit and the second insulating layer, wherein a portion of the third insulating layer in the peripheral circuit region is removed while the first and second insulating layers are patterned.

20. The method of claim 19 , wherein each of the first to third cell units comprises a NAND-type string including a plurality of serially connected cell transistors.

21. The method of claim 19, wherein each of the first to third cell units comprises a NOR-type memory cell.

* * * * *